(12) United States Patent
Kizer

(10) Patent No.: US 7,072,355 B2
(45) Date of Patent: Jul. 4, 2006

(54) PERIODIC INTERFACE CALIBRATION FOR HIGH SPEED COMMUNICATION

(75) Inventor: Jade M. Kizer, Mountain View, CA (US)

(73) Assignee: Rambus, Inc., Los Altos, CA (US)

( * ) Notice: Subject to any disclaimer, the term of this patent is extended or adjusted under 35 U.S.C. 154(b) by 201 days.

(21) Appl. No.: 10/645,201

(22) Filed: Aug. 21, 2003

(65) Prior Publication Data

US 2005/0041683 A1 Feb. 24, 2005

(51) Int. Cl.
*H04L 12/66* (2006.01)
(52) U.S. Cl. .................. 370/463; 370/419; 370/250
(58) Field of Classification Search ................ 370/463, 370/419, 241, 247, 248, 249, 252, 516, 518, 370/503, 250; 375/224, 226
See application file for complete search history.

(56) References Cited

U.S. PATENT DOCUMENTS

| | | | |
|---|---|---|---|
| 3,155,102 A | 11/1964 | Niederer, Jr. et al. | |
| 3,638,121 A | 1/1972 | Spilker, Jr. | |
| 3,922,491 A | 11/1975 | Bjork et al. | |
| 4,384,354 A | 5/1983 | Crawford et al. | |
| 4,648,133 A | 3/1987 | Vilnrotter | |
| 5,111,208 A * | 5/1992 | Lopez ................. | 342/174 |
| 5,122,978 A | 6/1992 | Merrill | |
| 5,243,626 A | 9/1993 | Devon et al. | |
| 5,436,908 A | 7/1995 | Fluker et al. | |
| 5,485,490 A | 1/1996 | Leung et al. | |
| 5,511,091 A | 4/1996 | Saito | |
| 5,523,760 A | 6/1996 | McEwan | |
| 5,548,146 A | 8/1996 | Kuroda et al. | |
| 5,554,945 A | 9/1996 | Lee et al. | |
| 5,621,913 A | 4/1997 | Tuttle et al. | |
| 5,742,798 A | 4/1998 | Goldrian | |
| 5,859,881 A | 1/1999 | Ferraiolo et al. | |
| 6,047,346 A | 4/2000 | Lau et al. | |
| 6,219,384 B1 | 4/2001 | Kliza et al. | |
| 6,282,210 B1 | 8/2001 | Rapport et al. | |
| 6,321,282 B1 | 11/2001 | Horowitz et al. | |
| 6,359,931 B1 | 3/2002 | Perino et al. | |
| 6,369,652 B1 | 4/2002 | Nguyen et al. | |
| 6,377,640 B1 | 4/2002 | Trans | |

(Continued)

FOREIGN PATENT DOCUMENTS

JP 0200035831 A 8/1990

OTHER PUBLICATIONS

Widmer, A.X., et al., "A DC-Balanced, Partitioned-Block, 8B/10B Transmission Code," IBM J. Res. Develop., vol. 27, No. 5, Sep. 1983, 440-451.

(Continued)

*Primary Examiner*—Brian Nguyen
(74) *Attorney, Agent, or Firm*—Mark Haynes; Haynes Beffel & Wolfeld LLP

(57) ABSTRACT

A high-speed communication interface manages a parallel bus having N bus lines. N+1 communication lines are established. A maintenance operation is performed on one of the N+1 communication lines, while N of the N+1 communication lines is available for data from the N line bus. The communication line on which the maintenance operation is performed, is changed after the operation is complete, so that all of the N+1 communication lines are periodically maintained, without interfering with communications on N of the N+1 communication lines.

48 Claims, 5 Drawing Sheets

U.S. PATENT DOCUMENTS

| | | | |
|---|---|---|---|
| 6,396,329 B1 | 5/2002 | Zerbe | |
| 6,421,389 B1 | 7/2002 | Jett et al. | |
| 6,434,081 B1* | 8/2002 | Johnson et al. | 365/233 |
| 6,442,644 B1 | 8/2002 | Gustavson et al. | |
| 6,448,815 B1 | 9/2002 | Talbot et al. | |
| 6,463,392 B1 | 10/2002 | Nygaard et al. | |
| 6,469,555 B1 | 10/2002 | Lau et al. | |
| 6,473,439 B1 | 10/2002 | Zerbe et al. | |
| 6,484,232 B1* | 11/2002 | Olarig et al. | 711/105 |
| 6,510,503 B1 | 1/2003 | Gillingham et al. | |
| 6,539,072 B1 | 3/2003 | Donnelly et al. | |
| 6,556,934 B1 | 4/2003 | Higashide | |
| 6,606,350 B1 | 8/2003 | Dress, Jr. et al. | |
| 6,606,576 B1* | 8/2003 | Sessions | 702/107 |
| 6,643,787 B1 | 11/2003 | Zerbe et al. | |
| 6,657,468 B1 | 12/2003 | Best et al. | |
| 6,690,741 B1 | 2/2004 | Larrick, Jr. et al. | |
| 6,717,992 B1 | 4/2004 | Cowie et al. | |
| 6,889,357 B1* | 5/2005 | Keeth et al. | 714/814 |
| 2001/0048382 A1 | 12/2001 | Low et al. | |
| 2001/0053175 A1 | 12/2001 | Hoctor et al. | |
| 2001/0056332 A1 | 12/2001 | Abrosimov et al. | |
| 2002/0072870 A1 | 6/2002 | Adam et al. | |
| 2002/0138224 A1 | 9/2002 | Sessions | |
| 2002/0149824 A1 | 10/2002 | Beaulieu et al. | |
| 2003/0026399 A1 | 2/2003 | Carlson | |
| 2003/0063597 A1 | 4/2003 | Suzuki | |
| 2003/0146800 A1 | 8/2003 | Dvorak | |
| 2003/0198212 A1 | 10/2003 | Hoctor et al. | |
| 2003/0198308 A1 | 10/2003 | Hoctor et al. | |
| 2004/0032354 A1 | 2/2004 | Knobel et al. | |
| 2004/0057500 A1 | 3/2004 | Balachandran et al. | |
| 2004/0217881 A1* | 11/2004 | Pedyash et al. | 340/870.07 |

OTHER PUBLICATIONS

Banu, Mihai, et al., "TA 6.4: A 660Mv/s CMOS Clock Recovery Circuit with Instantaneous Locking for NRZ Data and Burst-Mode Transmission," IEEE International Solid State Circuits Conference, 1993, 102-103, 270.

Eldering, Charles A., et al., "Digital Burst Mode Clock Recovery Technique for Fiber-Optic Systems," Journal of Lightwave Technology, vol. 12, No. 2, Feb. 1994, 271-279.

Chang, Ken K. Y., et al., "A 2 Gb/s Asymmetric Seial Link for High-Bandwidth packet Switches," Hot Interconnects V, Stanford University, Aug. 1997, 1-9.

Hu, Timothy H., et al., "A Monolithic 480 Mb/s Parallel AGC/Decision/Clock-Recovery Circuit in 1.2- CMOS," IEEE Journal of Solid-State Circuits, vol. 28, No. 12, Dec. 1993, 1314-1320.

Kim, Sungjoon, et al, "An 800Mbps Multi-Channel CMOS Serial Link with 3x Oversampling," IEEE 1995 Custom Integrated Circuits Conference, 22.7.1-22.7.4.

Nakamura, Kazuyuki, et al., "A 6 Gbps CMOS Phase Detecting DEMUX Module Using Half-Frequency Clock," 1998 Symposium on VLSI Circuits Digest of Technical Papers, 196-197.

Poulton, John, et al., A Tracking Clock Recovery Receiver for 4Gb/s Signaling, Hot Interconnects '97, Aug. 21-23, 1997, Palo Alto, CA, 1-13.

Dally, W, et al., "Digital Systems Engineering," Cambridge University Press, 1998, pp. 447-449.

Cerisola, M., et al., "CORD—a WDM Optical Network: Control Mechanism Using Subcarrier Multiplexing and Novel Synchronization Solutions," Communications, 1995. ICC 95 Seattle, Gateway to Globalization, 1995 IEEE International Conference on , vol. 1 , Jun. 18-22, 1995 pp. 261-264 vol. 1.

Zerbe, Jared et al., U.S. Appl. No. 09/776,550 filed Feb. 2, 2001, entitled "Method and Apparatus for Evaluating and Calibrating a Signaling System.".

Zerbe, Jared et al., U.S. Appl. No. 09/976,170 filed Oct. 21, 2001, entitled "Method and Apparatus for Evaluating and Optimizing a Signaling System.".

U.S. Appl. No. 10/278,708 filed Oct. 22, 2002, entitled "Phase Adjustment Apparatus and Method for a Memory Device Signaling System.".

Danielle, N. et al., "Principle and Motivations of UWB Technology for High Data Rate WPAN Applications," SOC 2003, 4 pages.

Win, Moe Z., et al., "Impulse Radio: How it Works," IEEE Communications Letters 2(2), Feb. 1998, 36-38.

Danielle, Norbert, "Ultra Wide Band Principles and Applications for Wireless Communications," CEA-LETI Annual Review, Jun. 25 and 26, 2002, 24 pages.

U.S. Appl. No. 09/941,079 filed Aug. 28, 2001 entitled "Clock Data Recovery with Selectable Phase Control Input.".

Yang, Chih-Kong Ken "Design of High-Speed Serial Links in CMOS" Technical Report No. CSL-TR-98-775, Sponsored By Center for Integrated Systems, Sun Microsystems and LSI Logic Inc. Dec. 1998, pp. 1-182.

Nakase, Yasunobu et al, "Source-Synchronization and Timing Vernier Techniques for 1.2-GB/s SLDRAM Interface," IEEE Journal of Solid-State Circuits, vol. 34, No. 4 (Apr. 1999), 494-501.

Gillingham, Peter, "SLDRAM Architectural and Functional Overview," SLDRAM Consortium (Aug. 29, 1997), 1-14.

"Draft Standard for a High-Speed Memory Interface (SyncLink)", Draft 0.99 IEEE P1596.7-199X (1996), 56 pages.

Gillingham, Peter, "SLDRAM: High-Performance, Open-Standard Memory," IEEE (1997), 29-39.

SLDRAM Inc., "400 Mb/s/pin SLDRAM," Draft Advance (Jul. 9, 1998), 1-69.

RAMBUS "Direct Rambus Short Channel Layout Guide, Version 0.95" (Aug. 2001), 40 pages.

RAMBUS "Direct Rambus Long Channel Design Guide" (2000), 45 pages.

INTEL "How to Measure RDRAM* System Clock Jitter" Application Note AP-667 (Jun. 1999), pp. 1-15.

Chang, Kun Yung "Design of a CMOS Asymmetric Serial Link" A Dissertation Submitted to the Department of Electrical Engineering and the Committee on Graduate Studies of Stanford University Aug. 1999, 119 pages.

RAMBUS, Inc. "RDRAM Direct Rambus Clock Generator" (Apr. 2002), 22 pages.

U.S. Appl. No. 10/278,478, Filed Oct. 22, 2002 entitled "Timing Calibration Apparatus and Method for a Memory Device Signaling System".

Chang, Kun-Yung "Design of a CMOS Asymmetric Serial Link" A Dissertation Submitted to the Department of Electrical Engineering and the Committee on Graduate Studies of Stanford University Aug. 1999, 119 pages.

SLDRAM Inc. "400 Mb/s/pin SLDRAM" 4M × 18 SLDRAM, Jul. 9, 1998, pp. 1-69.

Peter Gillingham "SLDRAM Architectural and Functional Overview" Aug. 29, 1997, pp. 1-14.

Peter Gillingham et al. "SLDRAM: High-Performance, Open-Standard Memory" IEEE Nov./Dec. 1997, pp. 29-39.

Microprocessor and Microcomputer Standards Subcommittee of the IEEE Computer Society "Draft Standard for a High-Speed Memory Interface (SyncLink)" 1996 pp. 1-56.

Direct Rambus Short Channel Layout Guide Aug. 2001, pp. 1-40.

Direct Rambus Long Channel Design Guide, 2000, pp. 1-45.

How to Measure RDRAM* System Clock Jitter, Intel Jun. 1999, pp. 1-15.

Lluis Paris et al. "WP 24.3 A 800MB/s 72 Mb SLDRAM with Digitally-Calibrated DLL" IEEE International Solid-State Circuits Conference 1999,, pp. 1-5.

Yasunobu Nakase et al. "Source-Synchronization and Timing Vernier Techniques for 1.2 GB/s SLDRAM Interface" IEEE Journal of Solid-State Circuits, vol. 34, No. 4, Apr. 1999.

RDRAM Direct Rambus Clock Generator, Apr. 2002, pp. 1-22.

Lluis Paris et al. "WP 24.3: An 800MB/s 72 Mb SLDRAM with Digitally-Calibrated DLL" ISSCC Slide Supplement IEEE 1999, pp. 352-353.

RaSer™ X Product Brief, "Highly Flexible 10 Gbps Backplane Serial Link Interface," Copyright 2003 Rambus, Inc., all rights reserved, 2 pages.

Yellowstone Technology Brief, "High Performance Memory Interface Technology," Copyright 2003 Rambus, Inc., all rights reserved, 2 pages.

Redwood Technology Brief, "High Performance Parallel Bus Interface Technology," Copyright 2003 Rambus, Inc., all rights reserved, 2 pages.

RDRAM® Overview, "High Performance Memory Interface Solution," Copyright 2003 Rambus, Inc., all rights reserved, 4 pages.

Lewis, Dave, "Easy-to-Use LVDS Serdes for the Serdes Neophyte," National Semiconductor, National Edge (Sep. 2001) 5 pages, http://www.national.com/nationaledge/sep01/864.html .

* cited by examiner

PERIODIC INTERFACE CALIBRATION FOR HIGH SPEED COMMUNICATION

BACKGROUND OF THE INVENTION

1. Field of the Invention

The present application relates to high-speed communication interfaces, including high-speed parallel bus interfaces for integrated circuits; and more particularly to calibration of such interfaces.

2. Description of Related Art

High-performance data processing applications are driving the demand for data rates past the GigaHertz range. As processor clock speeds increase to meet the demand, high-performance parallel bus interface technology is being developed to meet these needs. In parallel bus interfaces, a number of serial lines are operated in parallel. So-called SERDES (short for serializer-deserializer) technologies are being applied for each of the parallel lines. Other high-performance bus interface technologies are provided by Rambus, Inc., including products provided under the tradenames XDR™ High Performance Memory Interface Technology, Raser™ High Performance Interface Technology, and Redwood™ High Performance Parallel Bus Interface Technology. Background concerning high speed interfaces is found in U.S. Pat. No. 6,396,329 B1, entitled Method and Apparatus for Receiving High Speed Signals with Low Latency; and in U.S. Pat. No. 6,473,439, entitled Method and Apparatus for Fail-Safe Resynchronization with Minimum Latency.

One problem which becomes more important as communication speeds increase is calibration of clocks and sample timing. The optimal sampling point for each bit of data is controlled by many independent variables, which can be boiled down to a simple relationship between clock and data. There is an optimal singular sampling point for all data patterns at any given moment. Complicating matters are changes to the optimal sampling point. High-frequency noise, known as jitter, places a cloud of uncertainty around this optimal sampling point. Methods to compensate for jitter have been limited in effectiveness. Thus, systems with very low jitter are preferred. Low-frequency noise, known as skew, comprises slowly changing offsets in the optimal sampling point, for which compensation can be provided, depending on the system's ability to track of these sources of error.

Several methods have been developed to track and calibrate the sources of error that cause skew. One method is known as oversampling. Oversampling requires sampling the data more than once per bit time and coding the data for guaranteed transitions. These oversampling approaches involve clock/data recovery schemes that use clock/data patterns such as 8b/10b, and the like. Most current SERDES technologies use the 8a/10b coding scheme. This approach has the advantage that it relies on the same number of physical channels as logical channels for the communication link. However, there is an inherent 25% bandwidth penalty built-in the 8b/10b coding scheme. Also, the oversampling requires increased power consumption.

Another method for tracking and calibrating sources of error of involves performing an initial calibration, and then letting the system run open loop. This process requires good circuits to track all temperature-related drift components. One well-known example of this approach is known as the source synchronous technique. A timing reference is sent, typically on an independent physical channel, along with the data to compensate for drift between clock and data. The tracking time constant needs to be as fast as possible, with minimum time lag. Additionally, a single offset value would be optimal for all operating conditions on each of the lines in the parallel bus. If good tracking can be achieved across all drift conditions on all of the lines in the parallel bus, a source synchronous approach is quite compelling.

In another approach, where tracking times are not optimal, each link can be temporarily disabled and used for a fast periodic calibration. This type of periodic calibration requires precise logical synchronization between transmit and receive operations to perform the calibration efficiently during a calibration window, without jeopardizing real data in the process. Although synchronized periodic operations may be possible in a master-slave implementation, peer-to-peer periodic operations may be too prohibitive to be efficiently incorporated.

Selecting an optimal chip-to-chip interconnect strategy relies not only on the traditional metrics of latency and effective bandwidth, but also the area and power required to do so. System solutions that provide superior area/bandwidth and power/bandwidth trade-offs, while still meeting the bandwidth and latency requirements of system designers, are required to continue to scale performance in line with expected trends.

SUMMARY OF THE INVENTION

The present invention provides a communications interface, including transmitters and receivers, adapted for periodic calibration, and a method for maintaining calibration of communication paths across the interface. The periodic calibration process can operate substantially continuously, as a background process during operation of the interface to maintain the communication lines during long intervals of constant use without reset or other initialization events that allow time for typical line maintenance operations.

A method according to the present invention manages a high-speed communication interface for a parallel bus having N bus lines at the logical layer. In the physical layer, N+1 communication lines are established. A maintenance operation (calibration for example) is performed on one of the N+1 communication lines, while N of the N+1 communication lines is available for data from the N line parallel bus. The communication line on which the maintenance operation is performed, is changed after the operation is complete, so that all of the N+1 communication lines are periodically maintained, without interfering with communications on N of the N+1 communication lines.

Where the maintenance operation is calibration, a calibration signal, such as a pseudorandom bit sequence adapted for calibration of receiver clocks, is transmitted from a source, and received at a destination, on one particular communication line, referred to as communication line (n), of the N+1 communication lines. At the same time, a path is maintained for communication of data on N communication lines. A parameter associated with communication line (n) is calibrated. Then, after calibrating the parameter associated with communication line (n), the index (n) is changed and the process is repeated for a next communication line. Accordingly, one of the N+1 communication lines is used for calibration at a time, and is rotated according to a pattern so that each of the N+1 communication lines is calibrated over time.

Embodiments of the method include entering a reduced power consumption state on at least one of receivers and transmitters on the N communication lines, for example when data is not being supplied from the N line bus, while continuing to perform the periodic maintenance operation on the communication lines. In this manner, powerdown states are supported without losing maintenance, such as calibration, of the high-speed parallel data interface. In one embodiment, the system includes a "nap" mode, during which the periodic maintenance procedure continues, while other circuitry supporting the communication lines are in a power down state. During the "nap" mode, the maintenance procedure may operate with a cycle time that is less than, the same as or greater than the cycle time during normal operations of the communication lines. The system may also support a mode in which the maintenance procedures are stopped, and circuitry supporting the maintenance procedures is in a power down state.

The present invention also provides a method for switching the communication line subject of maintenance, without interrupting dataflow. The method includes, for example, changing the index (n) to switch a first particular communication line from being subject of maintenance to communicating from a line on the N line bus, and a second particular communication line from communicating from the line on the N line bus to being subject of maintenance, routing the first and second particular communication lines together from the line in the N line bus during a settling interval, and then, after the settling interval, performing maintenance on the second particular communication line.

The index (n) is changed in embodiments of the present invention according to a continuous periodic function, so that each of the N+1 communication lines is maintained at least once during a period of the continuous periodic function. Where the set of N+1 communication lines includes communication lines logically identified as paths 0 to N, one pattern comprises a repeating pattern beginning with the index (n) equal to zero, and increasing to (n) equal to N, and then decreasing to (n) equal to zero.

The present invention is also embodied by signal interfaces supporting the source and destination ends of the communication lines. Thus, an embodiment of the invention includes a set of signal lines having N+1 signal lines and N+1 receivers coupled to respective signal lines in a set of signal lines, which together establish a set of N+1 signal paths. The set of N+1 signal paths is adapted to serve an N line bus. A line maintenance circuit, such as the calibration circuit, is included in the interface. A switch placed in the N+1 signal paths, such as between the N+1 receivers and the N line bus, and control logic for the switch, operate to selectively route N signal paths in the set to the N line bus and one signal path, signal path (n), in the set to the line maintenance circuit. The index (n) is changed as discussed above to maintain the signal paths in the set without interfering with dataflow.

According to embodiments of the invention, the line maintenance circuit comprises a calibration circuit. For example, a calibration circuit is used to set adjustable clock generators that are used to supply receiver clocks for each of the N+1 receivers.

In yet other embodiments, logic is included to power down the N+1 receivers while continuing to maintain signal paths in a set of signal paths according to the pattern.

Other embodiments of the invention are implemented on the source side of the communication line. In such embodiments, an N line bus feeds a set of signal lines having N+1 signal lines. N+1 transmitters are coupled to the set of signal lines establishing a set of N+1 signal paths. A line maintenance circuit is included. A switch is coupled to the N+1 signal paths. Control logic for the switch selectively routes N signal paths in the set from the N line bus to N signal lines in the set of signal lines, and routes one signal path, signal path (n), in the set from the line maintenance circuit to the signal line (n). The index (n) is changed so that the line maintenance circuit is successively coupled to each of the N+1 signal lines according to the pattern, such as described above. Likewise, on the source side of the communication line, the N+1 transmitters can be powered down without interfering with the line maintenance process.

Further embodiments of the invention comprise the combination of the source side, destination side and communication media to provide a complete high-speed, parallel communication system.

Embodiments of the present invention support communication between integrated circuits at data rates greater than 100 MHz, and in some embodiments greater than 1 GHz, and more.

The example of line maintenance mentioned above involves transmission of calibration signals used for example for calibration of receiver clocks. Calibration can be applied to other parameters of the communication line, such as signaling levels, optimal placement of sampling times for symbol capture, and impedance of the termination element, and receiver thresholds. For communication lines that use adaptive equalization or filters, the maintenance can include adjustment of equalization or filter coefficients. The line management process can be applied to line maintenance applications which may or may not involve transmission of calibration signals.

Other aspects and advantages of the present invention can be seen on review of the drawings, the detailed description and the claims, which follow.

DETAILED DESCRIPTION

A detailed description of embodiments of the present invention is provided with reference to FIGS. 1–5.

Figure 1:
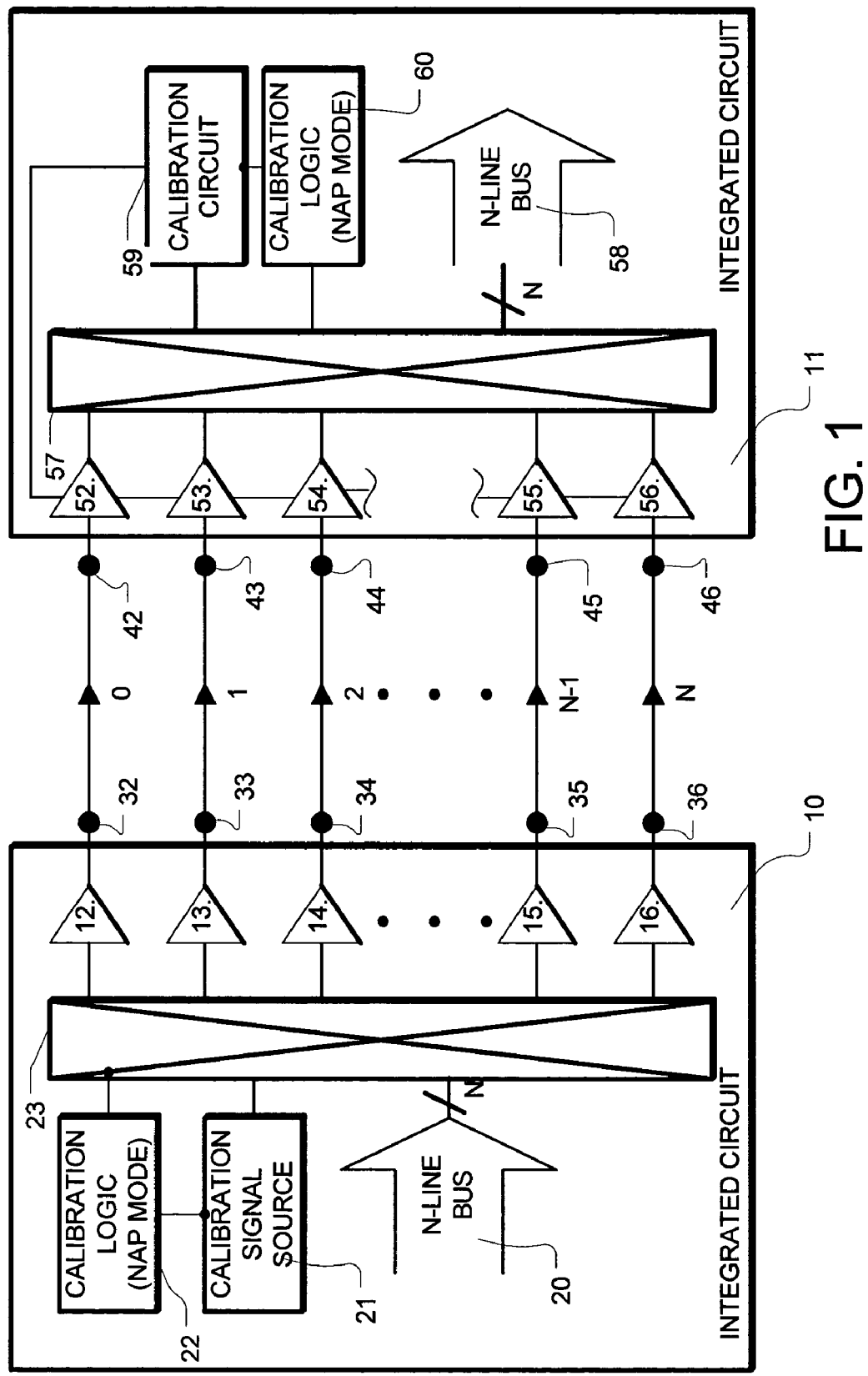
FIG. 1 is a simplified block diagram of a system employing periodic calibration.

FIG. 1 is a simplified block diagram of the communication system applying continuous periodic calibration according to the present invention. The system includes a first integrated circuit 10 and a second integrated circuit 11. The first integrated circuit 10 includes a logical layer parallel bus 20 including N lines, a calibration signal source 21, and calibration logic 22. A switch 23 couples the parallel bus 20 and the calibration signal source 21 with a set of transmitters 12–16, including one for each of N+1 physical layer communication lines. The set of transmitters 12–16 drives communication signals across communication media. In this example, the set of transmitters 12–16 drive data on signal lines coupled to input/output ports 32–36 (such as IO pins on the integrated circuit), which are coupled to respective transmission lines, including line 0 through line N in a set of N+1 transmission lines.

The second integrated circuit 11 includes complementary components. Input/output ports 42–46 are coupled by signal lines to respective receivers 52–56 in a set of N+1 receivers on the second integrated circuit 11. The receivers 52–56 are coupled to switch 57. Switch 57 routes the outputs of N receivers from the set to an N-line parallel bus 58, while routing the output of one of the receivers from the set to a calibration circuit 59. Calibration logic 60 on the second integrated circuit 11 controls the switch 57 and calibration circuit 59 to manage the continuous periodic calibration of the set of communication lines.

The logic 22 in the first integrated circuit 10 and the logic 60 in the second integrated circuit 11 support a nap state, in which the transmitters and receivers are placed in a power down mode when not needed, while the calibration cycle continues. This nap state maintains readiness of the high-speed parallel interface for fast transition from power conserving conditions to awake operations in the transmitting and receiving systems. In some embodiments, another low power state is included in which the calibration process is also stopped.

In FIG. 1, the communication links are shown operating in one direction. The invention is also extended to bidirectional communication links, where the receivers and transmitters, and other supporting logic, are found on both the first and second integrated circuits.

The continuous periodic calibration process uses an extra link to provide a mechanism to time multiplex the calibrating operation across an interface. In a parallel interface with eight logical links (N=8), nine physical links would be used with one assigned in a rotating pattern to be the calibration link. The calibration link spends as much time calibrating as necessary, without affecting worst-case latency of the system. The rate of rotation among the set of communication links can be adapted to suit the needs of the particular implementation. For example, in systems applying spread spectrum clocking, in which the clock rate is varied over a relatively slow interval, the rate of rotation among the communication links should be high enough that the changes in clock rate due to spread spectrum processing are not impacted. In other examples, the rate of rotation should be fast enough to accommodate known sources of skew of the parameter being calibrated, such as temperature drift coefficients.

The continuous periodic calibration process can be extended to glue multiple parallel interfaces together, for example in a daisy chain configuration. The process yields a worst-case reduction in overall effective bandwidth to 1/N+1, where N is the number of logical links in the system. The rotation of the calibration link is done entirely in the physical layer in preferred embodiments, providing a seamless N link logical layer to the host system.

One difficulty can arise in the handoff between the rotating calibration link and a regular data link, especially in cases without any back channel communication supporting the rotation of the calibration operation. The handoff must be executed without loss of data in the transition, and requires some synchronization between the transmit side and the receive side.

Figure 2:
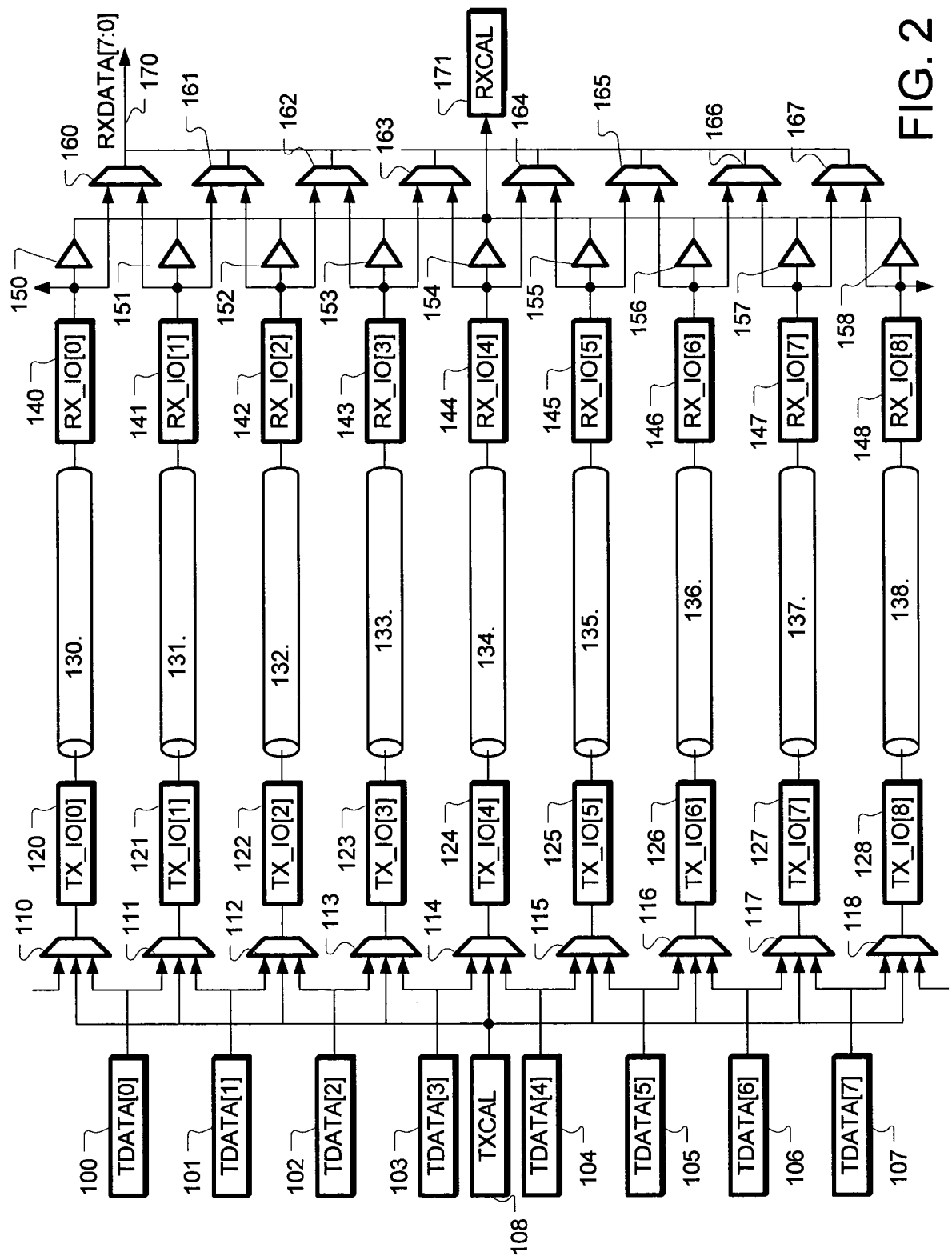
FIG. 2 is a more detailed diagram of physical layer signal paths in a system using continuous periodic calibration.

FIG. 2 illustrates one particular implementation of the physical layer in a high-speed parallel communication interface according to the present invention. With an input bus supplying eight bits of data (N=8), eight transmit data sources TDATA[0] to TDATA[7] (100–107) provide eight inputs from the logical layer. A transmit calibration signal source TXCAL (108) provides a ninth input. A switch includes nine physical layer, three-input multiplexers 110–118 having outputs coupled to respective transmitters TX_IO[0] to TX_IO[8] (120–128), which drive data on respective communication media 130–138. The inputs to the multiplexers 110–118 can be characterized with respect to the index (n), where (n) is an integer from 0 to N corresponding to the N+1 communication media 130–138. Each multiplexer (n) has as input the output of the transmit calibration source TXCAL 108, and input bus lines TDATA [n−1] and TDATA[n], except on the boundaries where multiplexer (0) 110 receives the input bus line TDATA[0] only, and multiplexer (N=8 to) 118 receives the input bus line TDATA[7] only. Extra inputs on the multiplexers 110 and 118 on the boundary may be used to support daisy-chaining multiple buses.

On the receive side, N+1 receivers RX_IO[0] to RX_IO [8] (140–148) are coupled to respective communication media 130–138. The outputs of the receivers 140–148 are each coupled to respective buffers 150–158 which drive the outputs to a receiver calibration circuit RXCAL 171. In addition, a switch includes eight physical layer, two-input multiplexers 160–167 coupled to the outputs of the receivers 140–148. The inputs to the multiplexers 160–167, can be characterized with respect to the index (n), where (n) ranges from 0 to N−1. Thus, the input two multiplexer(n) in the set of multiplexers 160–167 on the receive side include the outputs of receivers RX_IO[n] and RX_IO[n+1]. The outputs of the multiplexers 160–167 are coupled to the logical layer N line bus 170, providing a receive data RXDATA[7:0] (note that RXDATA[7:0] can be thought of as performing the reciprocal function of the TDATA[0] 100–TDATA[7] 107).

Control logic associated with the multiplexers on both sides manages the handoff between changing operation of a first particular communication link for calibration to communicating data, and changing operation of a second particular communication link from communicating data to operation for calibration. In one example, the link being calibrated is rotating among the set of N+1 communication lines according to a continuous periodic pattern, as can be understood with reference to an example, as follows. Assume that the communication link corresponding to index (n=1), comprising transmitter TX_IO[1] 121, communication medium 131, and receiver RX_IO[1], is currently assigned to the calibration task. In this state, the transmit data lines TDATA[7:0] from the input bus map to transmitters TX_IO[8:2,0]. Likewise, receivers RX_IO[8:2,0] map to receive data lines RXDATA[7:0]. The transmitter TX_IO [1] is transmitting calibration data, and the receiver RX_IO [1] is coupled to the receive calibration circuit RXCAL 171 via buffer 151. After calibration is complete on the receiver RX_IO[1], such as by adjusting the clock to the calibrated sampling point, the system is ready to change the link on which calibration is executed. An operation to switch the communication link assigned to the calibration task from index (n=1) to index (n=2) is executed as follows.

A) TDATA[1] is mapped to both transmitters TX_IO[1] and TX_IO[2].

B) The receiver RX_IO[1] is mapped to RDATA[1] at multiplexer 161, so that both RX_IO[2] and RX_IO[1] are transmitting the same data to the multiplexer 161.

C) RX_IO[2] is coupled to the receive calibration circuit RXCAL 171, and RX_IO[1] is selected by multiplexer 161 to apply data to RDATA[1].

D) TX_IO[2] is switched to the calibration signal source TXCAL 108.

E) RX_IO[2] starts supplying calibration data to the receive calibration circuit RXCAL 171.

At the completion of these steps, the input bus TDATA [7:0] is mapped via the transmitters TX_IO[8:3,1:0] across the media 138–133, 131 and 130 to the receivers RX_IO[8:3,1:0], to output bus RXDATA[7:0]. This operation occurs without interruption in the logical layer communications. After completion of calibration on the signal path including RX_IO[2], the process waits for TX_IO[2] to begin transmitting data once again. Then, the link being calibrated is changed to the next communication line.

Logic on the receive and transmit sides coordinates the changing of the calibration link. One simple approach would be to provide back channel communication such as operation codes in the logical layer that coordinate synchronizing rotation of the calibration link. However, this additional complexity at the logical layer may not be necessary in some embodiments. Another approach would be to use internal counters on both sides of the link synchronized during an initialization. With sufficient timing padding around the transition points, accuracy of the synchronization requirements could be reduced allowing each side to operate essentially open loop, with the possible exception of an initialization routine which establishes a starting point.

Figure 3:
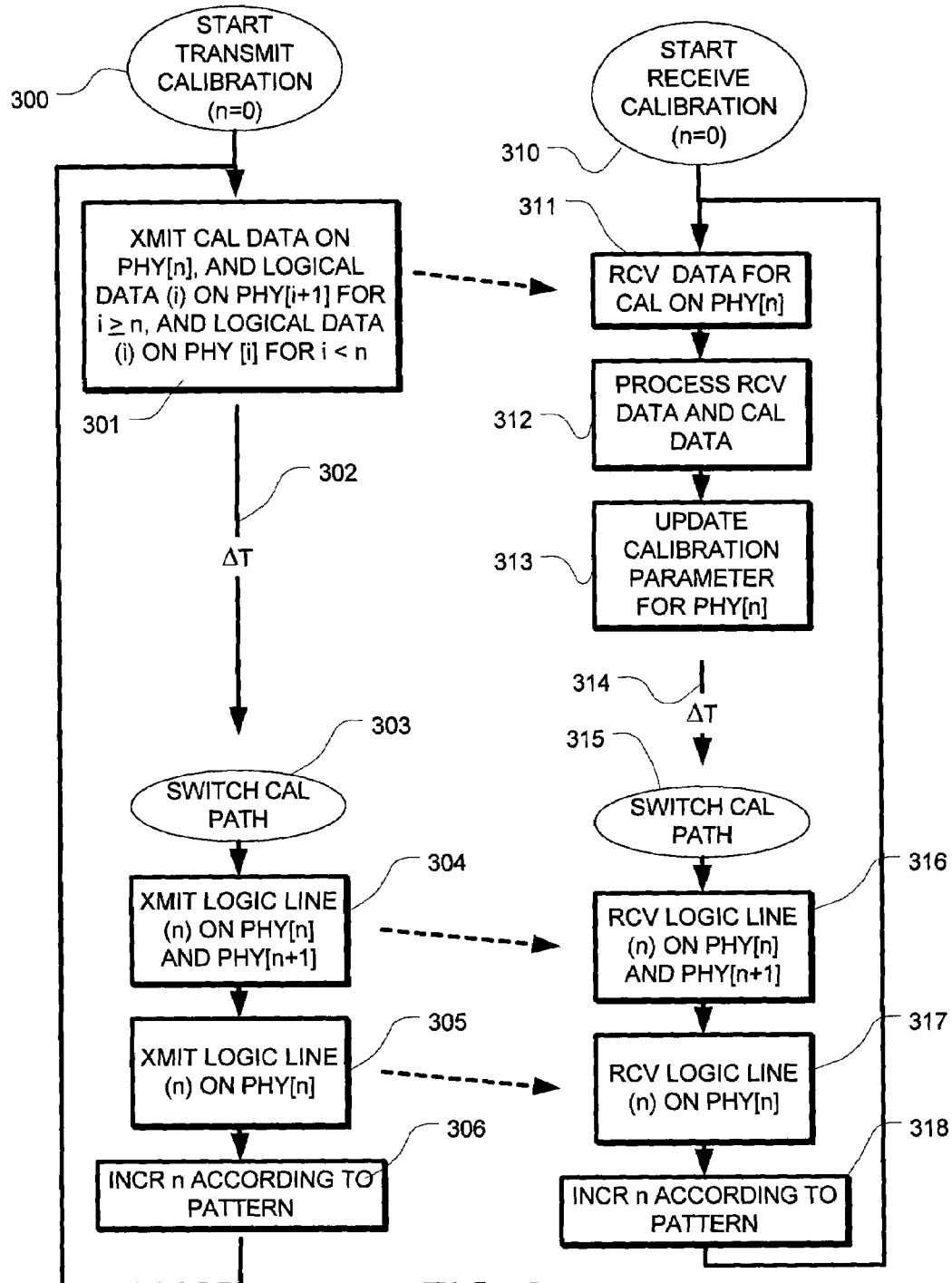
FIG. 3 shows flowcharts for continuous periodic calibration on the transmit side and on the receive side.

FIG. 3 illustrates one process for coordinating the changing of the calibration link. On the left side of FIG. 3, a routine for the transmit side is shown. On the right side of FIG. 3, a routine for the receive side is shown. In the flowcharts, each physical communication link PHY is given the index "i". For the communication link used for calibration the index i=n.

Calibration starts on the transmit side at block 300. At the start, calibration data is transmitted on the physical link PHY[n], and logical data is transmitted on the physical links PHY[i] for i<n, and PHY[i+1] for i>n (block 301). This is a representative mapping of the logical data to physical links for changing the calibration link in a pattern where the calibration link changes from link 0 through link N in an increasing manner. The mapping will be adapted according to the pattern used for changing the calibration link. The transmit side waits a time interval ($\Delta T$) represented by line 302, which is long enough to allow the receive side to complete calibration. After waiting a time interval, the process switches the calibration path (block 303). According to this process, logical data for input line (n) is transmitted on PHY[n] in parallel with the transmission on PHY[n+1], for a time corresponding to a settling interval at the receiver (block 304). Then, logical data for input line (n) is transmitted only on PHY[n] (block 305). At this point, the process is ready to change the calibration link, and the index (n) is changed according to a continuous periodic pattern (block 306). Then the process loops back to block 301, and repeats.

On the receive side, calibration starts at block 310. To begin the process, data for calibration is received on the physical link PHY[n] (block 311). The received calibration data is processed, and the logical data signals received on the other links are routed to the receiver bus (block 312). Line maintenance or calibration is executed for PHY[n], to for example update a calibration parameter like clock phase (block 313). The receiver then waits a time interval ($\Delta T$) represented by arrow 314, to provide a margin for synchronization with the transmit side of the high-speed parallel bus. After the time interval, the receiver switches calibration path (block 315). The process to switch the calibration path includes receiving logical data for bus line (n) on both PHY[n] and PHY[n+1] (block 316). After a settling interval, PHY[n+1] is switched to the receive calibration circuit RXCAL 171, while PHY[n] is coupled to the receiver bus (block 317). Thus, the next communication link PHY[n+1] is ready to receive calibration data. The value of the index (n) is changed according to the pattern (block 318), then the process loops back to block 311, and repeats.

According to one embodiment of the present invention, the pattern for the continuous periodic rotation, referring to FIG. 2, would be as follows:

n=0,1,2,3,4,5,6,7,8,7,6,5,4,3,2,1,0,1 . . .

This pattern simplifies the switching between links, as the handoff occurs between adjacent links in each step. However, the time between updates is not the same for all links. This difference in time between updates may not be a problem for a small number of links. However, larger error terms may be encountered for the communication systems in which many blocks are daisy chained together.

The worst-case update rate is described in equation 1, where N is the number of actual data links, and $T_{cal}$ is the total time for a link to calibrate and handoff to the next link.

$$T_{update}=2*N*T_{cal} \qquad \text{Eq. 1)}$$

Assuming a link takes about 1000 cycles to calibrate a clock at 400 MHz, and adding some time for synchronization, $T_{cal}$ can be approximated as five microseconds. This means the update frequency for an eight link system would be around 12.5 kHz. A reduction of calibration time by factor of 10 could potentially increase update frequency to about 150 kHz, if such a scheme could maintain synchronization and have the accuracy necessary for a given application. Other items such as spread spectrum clocking may affect the desired update rate.

Figure 4:
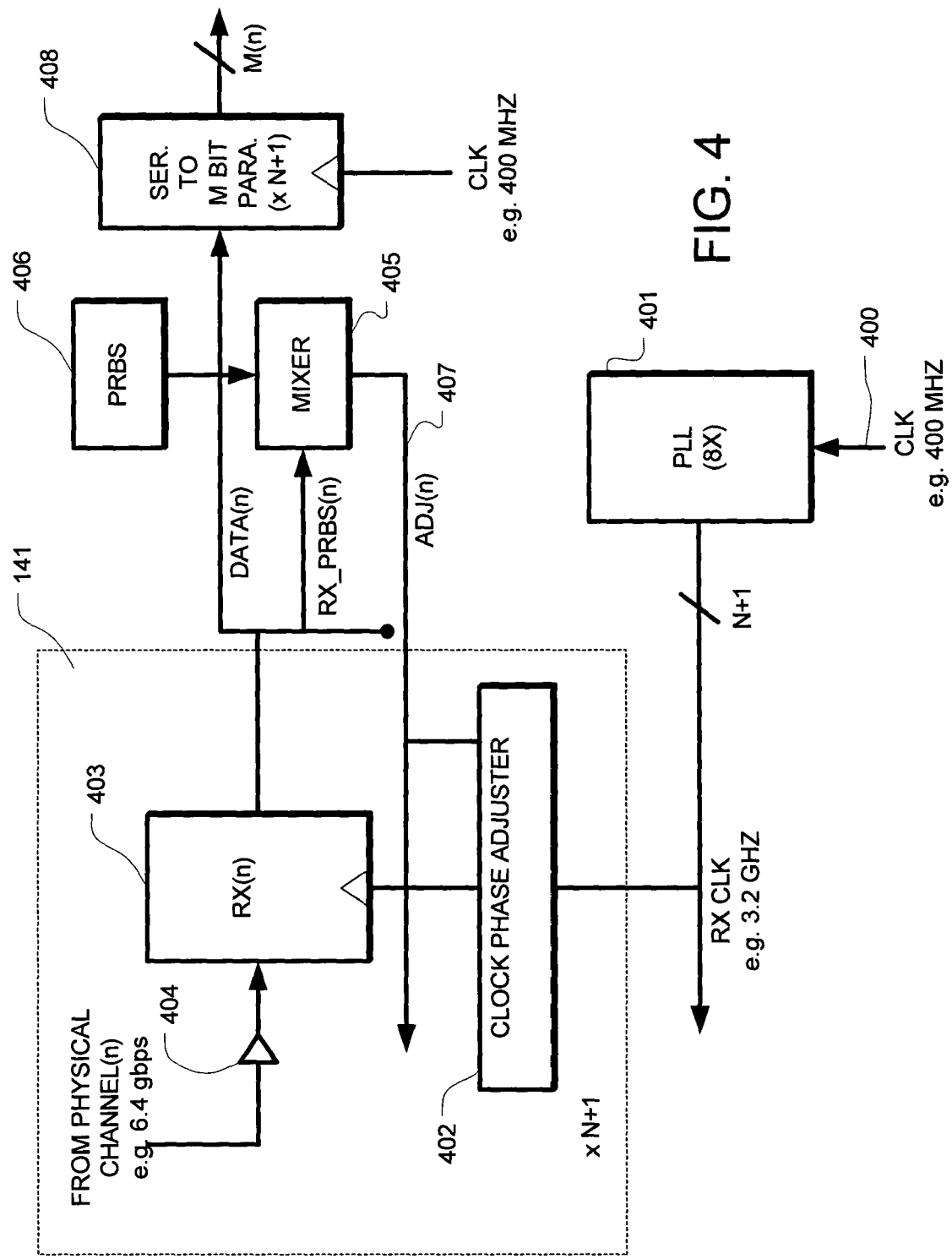
FIG. 4 illustrates circuitry for calibration of a receive clock in a circuit such as shown in FIG. 2.

By way of example, FIG. 4 is a simplified diagram of a system suitable for use with the continuous periodic calibration technique of the present invention, where the calibration is applied to adjusting clock phase to select optimal sampling point for a physical channel. In this example, only the receive side is illustrated. However, both transmit and receive sides receive a reference clock, in this example a 400 MHz clock on line 400. The reference clock is applied to a phase-locked loop circuit 401 which multiplies a clock by eight in this example to produce a receive clock at a frequency of 3.2 GHz. One copy of the receive clock is applied to each of the receivers, such as receiver 141. The receiver 141 includes a clock phase adjustment circuit 402 which applies a clock at the calibrated sampling point to receive sense amplifier 403. Input from the physical channel at 6.4 gigabits per second, where sampling occurs on each transition of clock is received through a buffer 404 into the sense amplifier 403. The output of the sense amplifier 403 is applied to the calibration circuit, which comprises the mixer 405, and a source 406 of a pseudorandom bit sequence used for calibration. The received pseudorandom bit sequence RX_PRBS(n) on the physical layer is applied to the mixer 405. The mixer 405 produces an adjustment parameter on line 407, which is applied to the clock phase adjuster 402. When the output of the sense amplifier 403 is used for data, it is applied to a serial-to-parallel converter 408, clocked at the reference clock rate, e.g. 400 MHz, to apply a parallel output at the reference clock rate. In this example, translating 6.4 gigabits per second to a 400 MHz clock would involve an 8-bit serial-to-parallel converter 408 for each of the receive signal paths.

Although much of the discussion has been addressed to calibration from the perspective of timing calibration, the invention can be applied to other functions requiring periodic adjustment of the physical channel for data transmission, such as current calibration, resistor calibration, adaptive equalization, and other types of line maintenance and tuning.

Figure 5:
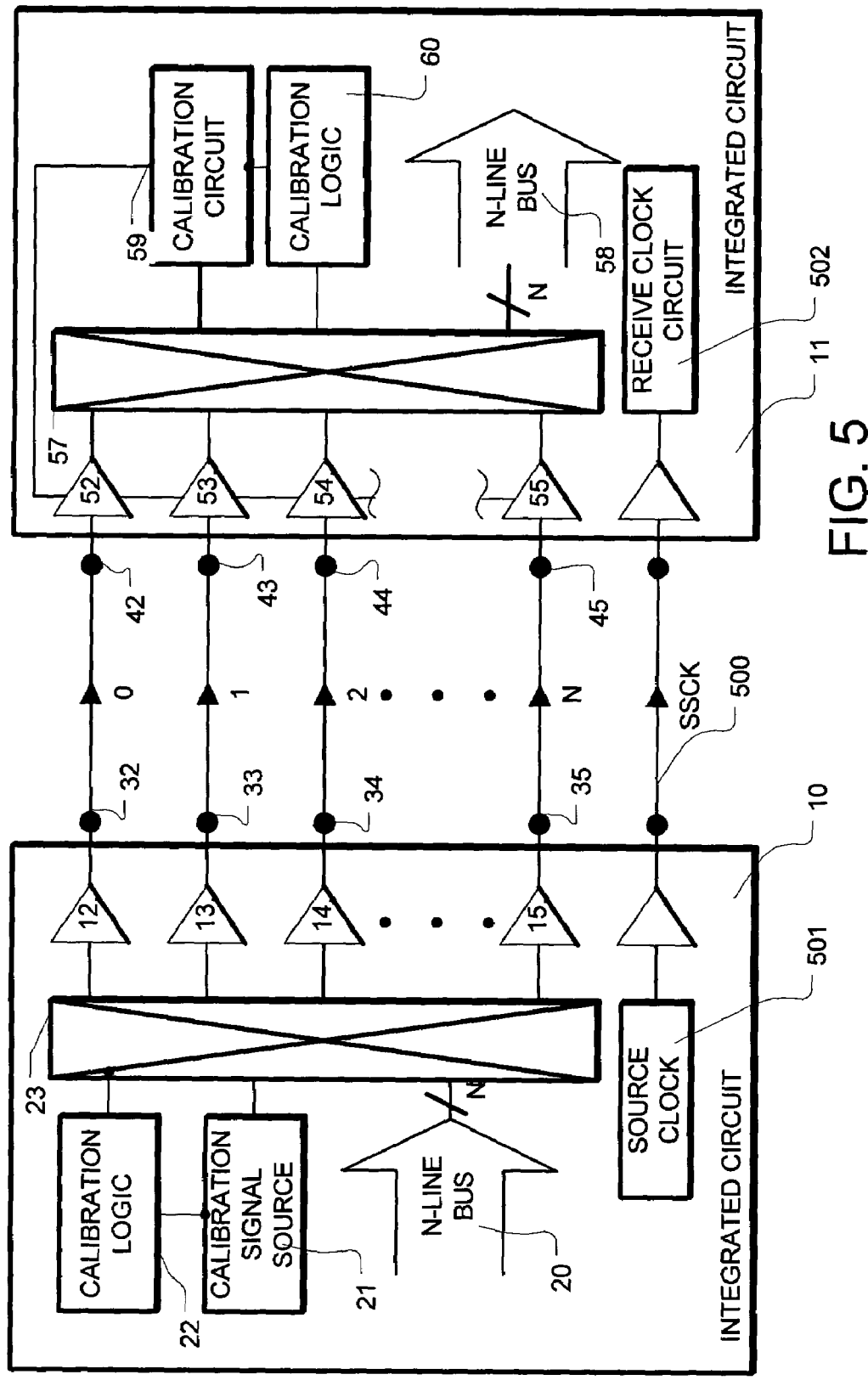
FIG. 5 is a simplified block diagram of a system employing periodic calibration, in combination with a source synchronous clock.

In some embodiments, a hybrid method of sending a source synchronous clock, along with continuous periodic calibration as described above can be used at the expense of an additional physical layer link to carry the clock. In FIG. 5, the system of FIG. 1 is shown using the same reference numerals, with an additional physical layer link 500 from a source clock 501 on the first integrated circuit 10 to a clock circuit 502 on the second integrated circuit used for carrying a source synchronous clock, which may be desirable in some environments where source synchronous clocking provides superior performance, and can be used in combination with the continuous periodic calibration process described herein. The additional physical layer link 500 carrying the clock may or may not be included in the continuous periodic calibration routine, as suits a particular implementation.

According to the present invention, continuous periodic calibration provides a solution for tracking slowly changing drift terms for ideal sampling of clock relative to data. It seamlessly calculates the best sampling point of data continuously, with the overhead of one extra IO, without knowledge of the logical layer.

The technique is particular suited to high-speed chip to chip communications.

In summary, the present invention provides methods and apparatus for providing continuous calibration of properties associated with a parallel interface that includes N links. The calibrated property may include for example signaling levels, optimal placement of sampling times for symbol capture, and impedance of the termination element or equalization coefficients associated with one of the N links. In one embodiment, continuous calibration of an optimal timing point for sampling by receiver circuit is provided using an additional link (N+1) to time multiplex a calibration sequence among the N links. The calibration is rotated or switched among the N+1 links, while normal communication is executed on the other N links.

While the present invention is disclosed by reference to the preferred embodiments and examples detailed above, it is to be understood that these examples are intended in an illustrative rather than in a limiting sense. It is contemplated that modifications and combinations will readily occur to those skilled in the art, which modifications and combinations will be within the spirit of the invention and the scope of the following claims.

What is claimed is:

1. A signal interface, comprising:
a set of signal lines having N+1 signal lines, where N is an integer;
N+1 receivers coupled to respective signal lines in the set of signal lines establishing a set of N+1 signal paths with the set of signal lines;
an N line bus;
a line maintenance circuit; and
a switch in the N+1 signal paths, and control logic for the switch, which selectively routes N signal paths in the set to the N line bus and signal path (n) in the set to the line maintenance circuit, where (n) is changed according to a pattern to selectively maintain signal paths in the set of N+1 signal paths while enabling data flow on N signal paths in the set to the N line bus; wherein for a change of (n) by switching a first particular signal path from routing to the line maintenance circuit to routing to a line in the N line bus, and a second particular signal path from routing to the line in the N line bus to the line maintenance circuit, the control logic controls the switch so that reception of data from the line in the N line bus is uninterrupted; and
wherein the receivers are responsive to respective receive clocks produced by adjustable clock generators, and said line maintenance circuit sets the adjustable clock generators in response to a calibration data pattern on the signal path coupled to the line maintenance circuit.

2. The signal interface of claim 1, wherein the pattern comprises a periodic pattern.

3. The signal interface of claim 1, wherein the set of N+1 signal paths includes signal paths logically identified as paths 0 to N, and the pattern comprises a repeating pattern beginning with (n) equal to 0 and increasing to (n) equal to N, and then decreasing to (n) equal to 0.

4. The signal interface of claim 1, wherein the control logic includes logic for coordinating the pattern with a source of data for the N line bus.

5. The signal interface of claim 1, wherein said N+1 receivers, said N line bus, said line maintenance circuit; and said switch comprise components of a single integrated circuit.

6. The signal interface of claim 1, further including logic to power down the N+1 receivers while continuing to selectively maintain signal paths in the set of signal paths.

7. The signal interface of claim 1, wherein the N+1 receivers are adapted to receive data with a data rate higher than 100 MegaHertz.

8. The signal interface of claim 1, wherein said N+1 receivers, said N line bus, said line maintenance circuit; and said switch comprise components of a single integrated circuit, and the N+1 receivers are adapted to receive data with a data rate higher than 100 MegaHertz from a source external to the integrated circuit.

9. The signal interface of claim 1, further including an additional signal line adapted to receive a source synchronous clock.

10. A signal interface, comprising:
a set of signal lines having N+1 signal lines, where N is an integer;
N+1 receivers coupled to respective signal lines in the set of signal lines establishing a set of N+1 signal paths with the set of signal lines;
an N line bus;
a line maintenance circuit; and
a switch in the N+1 signal paths, and control logic for the switch, which selectively routes N signal paths in the set to the N line bus and signal path (n) in the set to the line maintenance circuit, where (n) is changed according to a pattern to selectively maintain signal paths in the set of N+1 signal paths while enabling data flow on N signal paths in the set to the N line bus ,wherein for a change of (n) by switching a first particular signal path from routing to the line maintenance circuit to routing to a line in the N line bus, and a second particular signal path from routing to the line in the N line bus to the line maintenance circuit, the control logic controls the switch so that during a settling interval, the first and second particular signal paths both carry data from the line in the N line bus, and then after the settling interval the second particular signal path is coupled to the line maintenance circuit; and
wherein the receivers are responsive to respective receive clock signals produced by adjustable clock generators, and said line maintenance circuit sets the adjustable clock generators in response to a calibration data pattern on the signal path coupled to the line maintenance circuit.

11. A signal interface, comprising:
an N line bus;
a set of signal lines having N+1 signal lines, where N is an integer;
N+1 transmitters coupled to respective signal lines in the set of signal lines establishing a set of N+1 signal paths with the set of signal lines;
a line maintenance circuit; and
a switch in the N+1 signal paths, and control logic for the switch, which selectively routes N signal paths in the set from the N line bus to N signal lines in the set of signal lines, and routes signal path (n) in the set from the line maintenance circuit to signal line (n) in the set of signal lines, where (n) is changed according to a pattern to selectively perform maintenance on signal paths in the set of N+1 signal paths while enabling data flow on N signal paths in the set from the N line bus; wherein for a change of (n) by switching a first particular signal path from routing to the line maintenance circuit to routing to a line in the N line bus, and a second particular signal path from routing to the line in the N line bus to the line maintenance circuit, the control logic controls the switch so that transmission of data from the line in the N line bus is uninterrupted, wherein receivers coupled to the signal lines are responsive to respective receive clock signals produced by corresponding adjustable clock generators, and a line maintenance circuit coupled with the receivers sets the adjustable clock generators in response to a calibration data pattern on the signal path coupled to the line maintenance circuit coupled with the receivers.

12. The signal interface of claim 11, wherein the pattern comprises a periodic pattern.

13. The signal interface of claim 11, wherein the set of N+1 signal paths includes signal paths logically identified as paths 0 to N, and the pattern comprises a repeating pattern beginning with (n) equal to 0 and increasing to (n) equal to N, and then decreasing to (n) equal to 0.

14. The signal interface of claim 11, wherein the line maintenance circuit comprises a calibration signal source that produces a signal pattern adapted for calibration of receive clock signals.

15. The signal interface of claim 11, wherein the line maintenance circuit comprises a calibration signal source that produces a pseudo random signal pattern adapted for calibration of receive clock signals.

16. The signal interface of claim 11, wherein the control logic includes logic for coordinating the pattern with a destination of data for the N line bus.

17. The signal interface of claim 11, wherein said N+1 transmitters, said N line bus, said line maintenance circuit; and said switch comprise components of a single integrated circuit.

18. The signal interface of claim 11, further including logic to power down the N+1 transmitters while continuing to selectively perform maintenance on signal paths in the set of N+1 signal paths.

19. The signal interface of claim 11, wherein the N+1 transmitters are adapted to transmit data with a data rate higher than 100 MegaHertz.

20. The signal interface of claim 11, wherein said N+1 transmitters, said N line bus, said line maintenance circuit; and said switch comprise components of a single integrated circuit, and the N+1 transmitters are adapted to transmit data with a data rate higher than 100 MegaHertz to a destination external to the integrated circuit.

21. The signal interface of claim 11, further including an additional signal line adapted to transmit a source synchronous clock.

22. A signal interface, comprising:
an N line bus;
a set of signal lines having N+1 signal lines, where N is an integer;
N+1 transmitters coupled to respective signal lines in the set of signal lines establishing a set of N+1 signal paths with the set of signal lines;
a line maintenance circuit; and
a switch in the N+1 signal paths, and control logic for the switch, which selectively routes N signal paths in the set from the N line bus to N signal lines in the set of signal lines, and routes signal path (n) in the set from the line maintenance circuit to signal line (n) in the set of signal lines, where (n) is changed according to a pattern to selectively perform maintenance on signal paths in the set of N+1 signal paths while enabling data flow on N signal paths in the set from the N line bus for a change of (n) by switching a first particular signal path from routing from the line maintenance circuit to routing to a line in the N line bus, and a second particular signal path from routing to the line in the N line bus from the line maintenance circuit, the control logic controls the switch so that during a settling interval, the first and second particular signal paths both carry data to the line in the N line bus, and then after the settling interval the second particular signal path is coupled to the line maintenance circuit; and
wherein receivers coupled to the signal lines are responsive to respective receive clock signals produced by corresponding adjustable clock generators, and a line maintenance circuit coupled with the receivers sets the adjustable clock generators in response to a calibration data pattern on the signal path coupled to the line maintenance circuit coupled with the receivers.

23. A communication system for inter-chip signals, comprising:
a first integrated circuit, a second integrated circuit, and a set of N+1 communications lines between the first and second integrated circuits;
the first integrated circuit comprising
a first N line bus, where N is an integer;
a set of transmitter signal lines having N+1 transmitter signal lines coupled to respective communications lines in the set of N+1 communications lines;
N+1 transmitters coupled to respective transmitter signal lines in the set of transmitter signal lines establishing a set of N+1 transmitter signal paths with the set of transmitter signal lines;
a calibration signal source; and
a switch in the N+1 transmitter signal paths, and first control logic which selectively routes N transmitter signal paths in the set from the first N line bus to N transmitter signal lines in the set of signal lines, and routes transmitter signal path (n) in the set from the calibration signal source to one transmitter signal line in the set of transmitter signal lines, where (n) is changed according to a pattern to selectively supply calibration signals on communication lines in the set of N+1 communication lines while enabling data flow on N communication lines in the set from the first N line bus; and the second integrated circuit comprising
  a set of receiver signal lines having N+1 receiver signal lines coupled to respective communications lines in the set of N+1 communications lines;
  N+1 receivers coupled to respective receiver signal lines in the set of receiver signal lines establishing a set of N+1 receiver signal paths with the set of receiver signal lines;
  a second N line bus;
  a calibration circuit; and
  a switch in the N+1 receiver signal paths, and second control logic, which selectively routes N receiver signal paths in the set to the second N line bus and receiver signal path (n) in the set to the calibration circuit, where (n) is changed according to the pattern to selectively calibrate receiver signal paths in the set of N+1 receiver signal paths while enabling data flow on N receiver signal paths in the set to the second N line bus; and
  wherein the receivers are responsive to respective receive clock signals produced by adjustable clock generators, and said line maintenance circuit sets the adjustable clock generators in response to a calibration data pattern on the signal path coupled to the calibration circuit; and
  control logic on at least one of the first and second integrated circuits; wherein for a change of (n) by switching a first particular signal path from routing between the calibration signal source and the calibration circuit to routing to between lines in the first and second N line buses, and a second particular signal path from routing between lines in the first and second N line buses to routing between the calibration signal source and the calibration circuit, the control logic controls the switch so that transmission of data from between the lines in the first and second N line buses is uninterrupted.

24. The communication system of claim 23, wherein the pattern comprises a periodic pattern.

25. The communication system of claim 23, wherein the set of N+1 receiver signal paths includes receiver signal paths logically identified as paths 0 to N, and the pattern comprises a repeating pattern beginning with (n) equal 0 and increasing to (n) equal to N, and then decreasing to (n) equal to 0.

26. The communication system of claim 23, wherein the calibration signal source produces a signal pattern adapted for calibration of receive clock signals.

27. The communication system of claim 23, wherein the calibration signal source produces a pseudo random signal pattern adapted for calibration of receive clock signals.

28. The communication system of claim 23, wherein for a change of (n) by switching a first particular receiver signal path from routing to the calibration circuit to routing to a line in the second N line bus, and a second particular receiver signal path from routing to the line in the second N line bus to the calibration circuit, the second control logic controls the switch in the N+1 receiver signal paths so that during a settling interval, the first and second particular receiver signal paths both carry data for the line in the second N line bus, and then after the settling interval the second particular receiver signal path is coupled to the calibration circuit.

29. The communication system of claim 23, wherein the first control logic and second control logic include logic for coordinating the pattern.

30. The communication system of claim 23, including logic to power down the N+1 transmitters while continuing to selectively supply calibration signals on transmitter signal paths in the set of N+1 transmitter signal paths.

31. The communication system of claim 23, including logic to power down the N+1 receivers while continuing to selectively calibrate receiver signal paths in the set of N+1 receiver signal paths.

32. The communication system of claim 23, wherein the N+1 transmitters and the N+1 receivers are adapted to communicate via the set of communications lines with a data rate higher than 100 MegaHertz.

33. The communication system of claim 23, further including an additional communication line adapted for a source synchronous clock.

34. A communication system for inter-chip signals, comprising:
  a first integrated circuit, a second integrated circuit, and a set of N+1 communications lines between the first and second integrated circuits;
  the first integrated circuit comprising:
    a first N line bus, where N is an integer;
    a set of transmitter signal lines having N+1 transmitter signal lines coupled to respective communications lines in the set of N+1 communications lines;
    N+1 transmitters coupled to respective transmitter signal lines in the set of transmitter signal lines establishing a set of N+1 transmitter signal paths with the set of transmitter signal lines;
    a calibration signal source; and
    a switch in the N+1 transmitter signal paths, and first control logic which selectively routes N transmitter signal paths in the set from the first N line bus to N transmitter signal lines in the set of signal lines, and routes transmitter signal path (n) in the set from the calibration signal source to one transmitter signal line in the set of transmitter signal lines, where (n) is changed according to a pattern to selectively supply calibration signals on communication lines in the set of N+1 communication lines while enabling data flow on N communication lines in the set from the first N line bus; and
  the second integrated circuit comprising:
    a set of receiver signal lines having N+1 receiver signal lines coupled to respective communications lines in the set of N+1 communications lines;
    N+1 receivers coupled to respective receiver signal lines in the set of receiver signal lines establishing a set of N+1 receiver signal paths with the set of receiver signal lines;
    a second N line bus;
    a calibration circuit; and
    a switch in the N+1 receiver signal paths, and second control logic, which selectively routes N receiver signal paths in the set to the second N line bus and receiver signal path (n) in the set to the calibration circuit, where (n) is changed according to the pattern to selectively calibrate receiver signal paths in the set of N+1 receiver signal paths while enabling data flow on N receiver signal paths in the set to the second N line bus; and
  wherein the receivers are responsive to respective receive clock signals produced by adjustable clock generators, and said line maintenance circuit sets the adjustable clock generators in response to a calibration data pattern on the signal path coupled to the calibration circuit, and
  wherein for a change of (n) by switching a first particular transmitter signal path from routing from the calibration signal source to routing from a line in the first N line bus, and a second particular transmitter signal path from routing from the line in the first N line bus to routing from the calibration signal source, the first control logic controls the switch in the N+1 transmitter signal paths so that during a settling interval, the first and second particular transmitter signal paths both carry data from the line in the first N line bus, and then after the settling interval the second particular signal path is routed from the calibration signal source.

35. A method for managing a high speed communication interface for a parallel bus having N bus lines, where N is an integer, comprising:

establishing N+1 communication lines;

performing a maintenance operation on communication line (n) of the N+1 communications lines and enabling paths from the N bus lines on N of the N+1 communications lines, wherein receivers on the N+1 communications lines are responsive to respective receive clock signals produced by adjustable clock generators, and said maintenance operation sets the adjustable clock generators in response to a calibration data pattern transmitted on the communication line (n);

after performing the maintenance operation on communication line (n) of the N+1 communications lines, changing (n) and performing a maintenance operation a next communication line of the N+1 communication lines; and for a changing (n) to switch a first particular communication line from subject of the maintenance operation to communicating from a line on the N line bus, and a second particular communication line from communicating from the line on the N line bus to subject of the maintenance operation, routing the first and second particular communication lines so that both carry data from the line in the N line bus during a settling interval, and then after the settling interval performing the maintenance operation on the second particular communication line.

36. The method of claim 35, wherein performing the maintenance operation includes:

transmitting a calibration signal on the communication line (n) from a calibration signal source;

receiving the calibration signal on the communication line (n) of the N+1 communications lines; and calibrating a parameter associated with the communication line (n) on the N+1 communications lines in response to the calibration signal.

37. The method of claim 35, including transmitting data from the N bus lines while performing the maintenance operation on the communication line (n).

38. The method of claim 35, including entering a reduced power consumption state on at least one of receivers and transmitters on the N of the communication lines, while performing the maintenance operation on the communication line (n).

39. The method of claim 35, including changing (n) according to a continuous periodic pattern.

40. The method of claim 35, wherein the set of N+1 communication lines includes communication lines logically identified as paths 0 to N, and including changing (n) according to a repeating pattern beginning with (n) equal to 0 and increasing to (n) equal to N, and then decreasing to (n) equal to 0.

41. The method of claim 35, wherein performing the maintenance operation includes sending a calibration signal from a source on the communication line (n), the calibration signal comprising a signal pattern adapted for calibration of receive clock signals.

42. The method of claim 35, wherein performing the maintenance operation includes sending a calibration signal from a source on the communication line (n), the calibration signal comprising a pseudo random signal pattern adapted for calibration of receive clock signals.

43. The method of claim 35, further including providing a source synchronous clock.

44. A signal interface, comprising:

a set of signal lines;

a set of receivers coupled to respective signal lines in the set of signal lines;

a bus comprising a set of bus lines;

a line maintenance circuit; and a switch coupled to the set of receivers, to the bus and to the line maintenance circuit, and control logic for the switch, which selectively routes signals in parallel from receivers in the set of receivers to bus lines in the set of bus lines and to the line maintenance circuit, where the receiver in the set of receivers routed to the line maintenance circuit is changed according to a pattern to selectively maintain signal paths over said set of signal lines without interrupting data flow from the set of receivers from the set of signal lines; and wherein the receivers are responsive to respective receive clock signals produced by adjustable clock generators, and said line maintenance circuit sets the adjustable clock generators in response to a calibration data pattern on the signal path coupled to the calibration circuit.

45. A transmission circuit on an integrated circuit, comprising:

a line maintenance circuit to output a line maintenance signal;

a set of transmitters coupled to receive a first set of signals and the line maintenance signal, and to output a second set of signals, wherein the second set of signals includes the first set of signals and the maintenance signal; and a switch coupled to the set of transmitters and a control logic for the switch, to selectively route the first set of signals and the line maintenance signal in parallel to the set of transmitters, where the transmitter in the set of transmitters routed to the line maintenance circuit is changed according to a pattern to selectively maintain the second set of signals from the set of transmitters and to permit the maintenance signal to be used as a calibration signal, the transmitter in the set of transmitters routed to the line maintenance circuit is changed without interruption of transmission of the first set of signals, wherein receivers adapted to receive the second set of signals are responsive to respective receive clock signals produced by corresponding adjustable clock generators, and a line maintenance circuit coupled with the receivers sets the adjustable clock generators in response to a calibration data pattern in the maintenance signal.

46. A receiver circuit on an integrated circuit, comprising:

means for receiving a first set of signals and a line maintenance signal, and to output a second set of signals;

means for calibrating the means for receiving without interrupting the outputting of the second set of signals, the means for calibrating coupled to receive the line maintenance signal;

means for routing the first set of signals and the line maintenance signal in parallel from the means for receiving, wherein the routing changes according to a pattern to selectively maintain the second set of signals and to permit the maintenance signal to be used as a maintenance signal for maintaining different portions of the means for receiving; and wherein the maintenance signal comprises a calibration data pattern, and the means for receiving includes receivers that are responsive to respective receive clock signals produced by adjustable clock generators, and said means for calibrating sets the adjustable clock generators in response to the calibration data pattern.

47. A signal interface, comprising:

a set of signal lines having N+1 signal lines, where N is an integer;

N+1 receivers coupled to respective signal lines in the set of signal lines establishing a set of N+1 signal paths with the set of signal lines;

an N line bus;

a line maintenance circuit; and a switch in the N+1 signal paths, and control logic for the switch, which selectively routes N signal paths in the set to the N line bus and signal path (n) in the set to the line maintenance circuit, where (n) is changed according to a pattern to selectively maintain signal paths in the set of N+1 signal paths while enabling data flow on N signal paths in the set to the N line bus; wherein the line maintenance circuit performs calibration of the receiver coupled to signal path (n) routed to the line maintenance circuit, independent of the data flow on the N line bus; and wherein the receivers are responsive to respective receive clock signals produced by adjustable clock generators, and said line maintenance circuit sets the adjustable clock generators in response to a calibration data pattern on the signal path coupled to the calibration circuit.

48. A signal interface, comprising:

an N line bus;

a set of signal lines having N+1 signal lines, where N is an integer;

N+1 transmitters coupled to respective signal lines in the set of signal lines establishing a set of N+1 signal paths with the set of signal lines;

a line maintenance circuit; and a switch in the N+1 signal paths, and control logic for the switch, which selectively routes N signal paths in the set from the N line bus to N signal lines in the set of signal lines, and routes signal path (n) in the set from the line maintenance circuit to signal line (n) in the set of signal lines, where (n) is changed according to a pattern to selectively perform maintenance on signal paths in the set of N+1 signal paths while enabling data flow on N signal paths in the set from the N line bus, independent of the data flow on the N line bus; wherein receivers coupled to the signal lines are responsive to respective receive clock signals produced by corresponding adjustable clock generators, and a line maintenance circuit coupled with the receivers sets the adjustable clock generators in response to a calibration data pattern on the signal path coupled to the line maintenance circuit coupled with the receivers.

* * * * *